US010090162B2

(12) United States Patent
Tanaka et al.

(10) Patent No.: US 10,090,162 B2
(45) Date of Patent: Oct. 2, 2018

(54) PLASMA PROCESSING METHOD AND PLASMA PROCESSING DEVICE

(71) Applicant: HITACHI HIGH-TECHNOLOGIES CORPORATION, Minato-ku, Tokyo (JP)

(72) Inventors: Junya Tanaka, Tokyo (JP); Tetsuo Ono, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/556,455

(22) PCT Filed: Nov. 2, 2016

(86) PCT No.: PCT/JP2016/082508
§ 371 (c)(1),
(2) Date: Sep. 7, 2017

(87) PCT Pub. No.: WO2017/126184
PCT Pub. Date: Jul. 27, 2017

(65) Prior Publication Data
US 2018/0047573 A1    Feb. 15, 2018

(30) Foreign Application Priority Data

Jan. 18, 2016  (JP) ................................ 2016-006752

(51) Int. Cl.
*C03C 15/00*    (2006.01)
*C03C 25/68*    (2006.01)
(Continued)

(52) U.S. Cl.
CPC .... *H01L 21/3065* (2013.01); *H01J 37/32165* (2013.01); *H01L 21/31116* (2013.01);
(Continued)

(58) Field of Classification Search
USPC ........................................................ 216/71
See application file for complete search history.

(56) References Cited

U.S. PATENT DOCUMENTS 8,394,720 B2    3/2013   Fujihara
8,545,671 B2    10/2013  Honda
(Continued)

FOREIGN PATENT DOCUMENTS

CN       1883036 A       12/2006
JP       2000150196 A    5/2000
(Continued)

OTHER PUBLICATIONS

International Search Report dated Dec. 27, 2016 for related International Application No. PCT/JP2016/082508.
(Continued)

*Primary Examiner* — Roberts P Culbert
(74) *Attorney, Agent, or Firm* — Miles & Stockbridge P.C.

(57) ABSTRACT

Controllability of ion bombardment on a substrate is further improved to achieve uniformity of the etched substrate across the substrate surface.
A plasma processing apparatus performs plasma generation and control of energy of ion bombardment on the substrate independently, generates plasma by continuous discharge or pulse discharge, and switches at least two bias powers having different frequencies, and alternately and repeatedly applies the at least two bias powers having different frequencies to a sample stage while the plasma is being generated.

9 Claims, 10 Drawing Sheets

(51) Int. Cl.
*H01L 21/3065* (2006.01)
*H01L 21/67* (2006.01)
*H01L 21/311* (2006.01)
*H01J 37/32* (2006.01)
*H01L 21/3213* (2006.01)

(52) U.S. Cl.
CPC .. *H01L 21/32137* (2013.01); *H01L 21/67069* (2013.01); *H01J 37/32449* (2013.01); *H01J 37/32715* (2013.01); *H01J 2237/334* (2013.01)

(56) References Cited

U.S. PATENT DOCUMENTS

| | | |
|---|---|---|
| 2005/0112891 A1 | 5/2005 | Johnson et al. |
| 2007/0175856 A1 | 8/2007 | Johnson et al. |
| 2008/0178805 A1 | 7/2008 | Paterson et al. |
| 2008/0193673 A1 | 8/2008 | Paterson et al. |
| 2011/0220609 A1 | 9/2011 | Yaegashi et al. |
| 2013/0295774 A1 | 11/2013 | Shimizu et al. |

FOREIGN PATENT DOCUMENTS

| | | |
|---|---|---|
| JP | 2007509506 A | 4/2007 |
| JP | 2008244429 A | 10/2008 |
| JP | 2010512031 A | 4/2010 |
| TW | 200841775 A | 10/2008 |
| TW | 201027281 A | 7/2010 |
| TW | 201131648 A | 9/2011 |
| TW | 201207932 A | 2/2012 |

OTHER PUBLICATIONS

Office Action dated Nov. 7, 2017 for related Taiwan application No. 106101699.

Fig. 3 (a) LF : HF = 20% : 80%
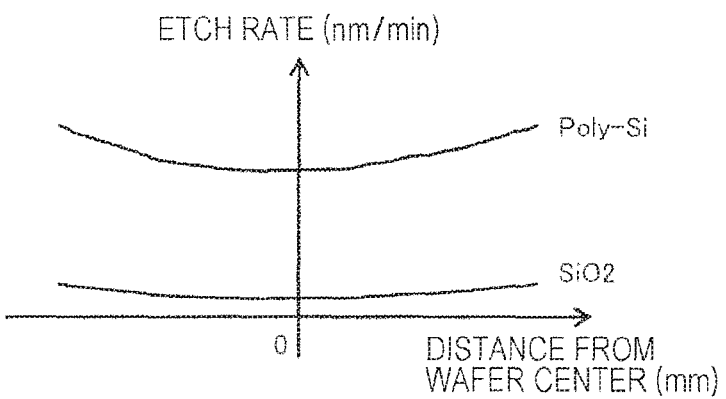
Fig. 3 (b) LF : HF = 50% : 50%
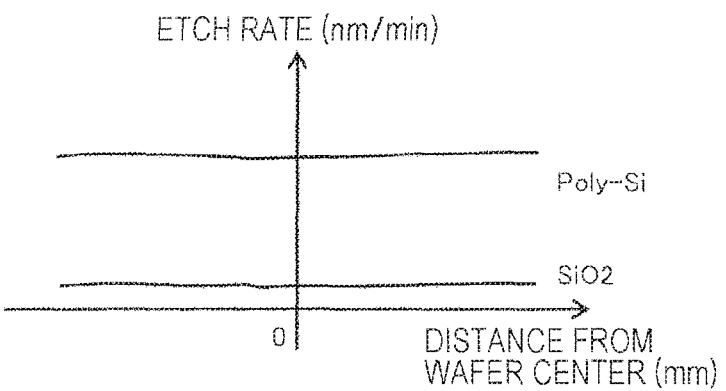
Fig. 3(c) LF : HF = 80% : 20%
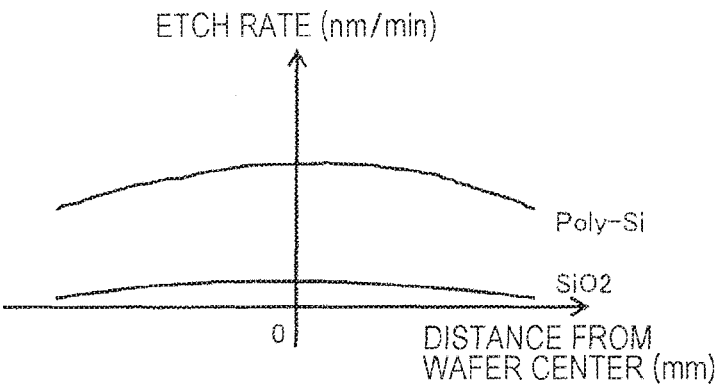

FIG. 11

| | (a) | (b) | (c) |
|---|---|---|---|
| DISTRIBUTION | ETCH RATE (nm/min) Poly-Si, SiO2 vs DISTANCE FROM WAFER CENTER (mm) | ETCH RATE (nm/min) Poly-Si, SiO2 vs DISTANCE FROM WAFER CENTER (mm) | ETCH RATE (nm/min) Poly-Si, SiO2 vs DISTANCE FROM WAFER CENTER (mm) |
| Poly-Si ETCH RATE (nm/min) | 51.6 | 45.2 | 30.2 |
| SiO2 ETCH RATE (nm/min) | 1.7 | 0.9 | 0.6 |
| Poly-Si/SiO2 SELECTIVITY | 30.4 | 50.2 | 50.3 |

PLASMA PROCESSING METHOD AND PLASMA PROCESSING DEVICE

TECHNICAL FIELD

The present invention relates to a plasma processing method and to a plasma processing apparatus each for use in fabrication of a semiconductor device and/or the like.

BACKGROUND ART

A semiconductor device, such as a metal-oxide-semiconductor field-effect transistor (MOSFET) device and/or the like for use in an electronic device or the like, is fabricated using a plasma etching technique. An etching process, using plasma, of a semiconductor substrate (hereinafter referred to simply as "substrate") requires process uniformity across the substrate surface for yield improvement with respect to the substrate. To achieve uniformity in etch profile across the substrate surface amid the progress of dimension reduction in recent years, control of ions bombarding the substrate from plasma is becoming more important.

Conventionally, examples of known plasma processing technology for use in fabrication of a semiconductor device include an apparatus for etching with high accuracy a film structure having a stepwise surface as described in PTL 1, which is a plasma processing apparatus including a vacuum vessel, a lower electrode disposed in a processing chamber in the vacuum vessel to mount a wafer on top thereof, a plurality of bias application units of different frequencies for supplying radio frequency (hereinafter referred to simply as "RF") power to produce a bias potential on the lower electrode, a gas supply means for feeding a reactive gas into the processing chamber, an electric-field providing means for providing an electric field to generate plasma in the processing chamber, and a regulation unit for regulating energy distribution of ions, in the plasma, bombarding the wafer by means of the RF power. In addition, the regulation unit is configured to control the output ratio (mixture ratio) between the bias powers having a plurality of frequencies generated by the bias application units, thus to change the energy of ions bombarding the wafer and the distribution thereof independently.

Moreover, examples of known technology to control energy of ions bombarding the wafer include, as described in PTL 2 for example, application of an RF voltage amplitude-modulated by a plasma processing apparatus having a cathode-coupling configuration, and application of an RF voltage frequency-modulated by a plasma processing apparatus having an anode-coupling configuration.

CITATION LIST

Patent Literature

PTL 1: JP 2008-244429 A
PTL 2: JP 2000-150196 A

SUMMARY OF INVENTION

Technical Problem

The conventional technology described in above-mentioned PTL 1 lacks sufficient foresight with respect to ion controllability to address further dimension reduction of devices. The details are as follows: the bias power for providing ions with energy to bombard the substrate is generated by combining (mixing) powers having a higher frequency and a lower frequency, and varying the mixture ratio thereof. Accordingly, the maximum potential difference (hereinafter designated as "Vpp") of the voltage waveform of the resultant composite RF power applied to the sample stage needs to be maintained at or below an allowable limit based on the hardware capability. Thus, the Vpp of each RF power is regulated below the maximum allowed value. This prevents each RF power from reaching the maximum power, thereby preventing the conventional technology from taking full advantage of use of different frequencies with respect to controllability.

Moreover, the waveform of the RF power generated by combination of powers having different frequencies may change irregularly, thus creating difficulty in finding an optimum condition. Furthermore, a possible problem of crosstalk caused by electrical signals affecting each other, and a need for impedance matching depending on the power mixture ratio, require a structural measure to be taken.

In addition, the conventional technology described in above-mentioned PTL 2 is a technology that generates plasma using a modulated RF voltage to control the electron temperature profile in the plasma, and to control the species and the amounts of ions and radicals generated. This conventional technology cannot control the ion bombardment energy independently, and is thus inadequate for further improving controllability of ion bombardment on the substrate. Moreover, frequency modulation of an RF voltage is performed using one power supply. This reduces promptness of switching upon frequency change, thereby making this conventional technology to be unsuitable for high accuracy control.

It is an object of the present invention to provide a plasma processing method and apparatus capable of further improving controllability of ion bombardment on a substrate.

Solution to Problem

The object described above can be achieved by: a plasma processing method including generating plasma from a process gas fed into a processing chamber by an RF power for plasma generation, applying RF bias powers having different frequencies to a sample stage on which a sample is disposed, and performing the plasma generation and control of energy of ion bombardment on the sample independently to perform plasma processing on the sample in the processing chamber wherein the plasma is either continuous discharge generated by continuously supplied power, or pulse discharge using a duty cycle and generated by intermittently supplied power, and at least two bias powers having different frequencies are switched from one to another, and are alternately and repeatedly applied to the sample stage when the plasma is being generated; and a plasma processing apparatus including a processing chamber, having a sample stage therein, into which a process gas is fed, and is exhausted to reduce a pressure inside the processing chamber to a predetermined pressure, a power supply for plasma generation that is coupled to the processing chamber, and generates plasma from the process gas fed into the processing chamber, and a power supply for bias that is connected to the sample stage, and supplies bias powers having different frequencies, wherein the plasma generation by the power supply for plasma generation and control of energy of ion bombardment on the sample placed on the sample stage caused by the power supply for bias are performed independently to perform plasma processing on the sample, in the power supply for plasma generation, supply of power for allowing the plasma to undergo continuous discharge, and supply of power for allowing the plasma to undergo pulse discharge, are configurable, the bias power supply includes at least two power supplies that output bias powers having different frequencies, and the plasma processing apparatus further includes a control device that controls the bias power supply to switch the bias powers having different frequencies, and to alternately and repeatedly supply the bias powers having different frequencies to the sample stage when the power supply for plasma generation generates the plasma.

Advantageous Effects of Invention

The present invention can increase the configurable range of bias powers having different frequencies, and can thus further improve controllability of ion bombardment on a substrate.

BRIEF DESCRIPTION OF DRAWINGS

FIGS. 3(a) to 3(c) are a set of diagrams each illustrating etch rate distributions in the output situations when a wafer is etched using the outputs illustrated in FIGS. 2(a) to 2(c).

FIG. 11 is a set of diagrams each illustrating etch rate distributions in the output situations when a wafer is etched using the outputs illustrated in FIGS. 10(a) to 10(c).

DESCRIPTION OF EMBODIMENTS

The embodiments described below each use a difference in energy distribution of ion bombardment on a processed substrate (hereinafter referred to as "wafer") caused by a change in the frequency of an RF bias power to further improve controllability of ion bombardment on the wafer. This aims at addressing further dimension reduction of semiconductor device structure, and thus providing uniformity of wafer etching process across the wafer surface, that is, both uniformity of etch rate across the wafer surface and uniformity of etch profile across the wafer surface.

In addition, such means controls a bias voltage applied to the wafer independently of plasma generation (i.e., provides control of the RF power applied to a sample stage for supplying energy to ions bombarding the wafer, independently of control of the RF power for plasma generation). Furthermore, the RF power applied to the sample stage is controlled by using a plurality of RF bias power supplies of different frequencies, and switching and alternately and repeatedly supplying the RF bias powers having different frequencies.

This repeated switching and alternation enables each of the RF bias powers having different frequencies to have a dedicated supply time period. This permits the RF bias power supply of each frequency to provide an output up to a maximum allowed value of the Vpp of the RF bias voltage applicable to the sample stage during processing to further improve controllability of ion bombardment on a wafer. One embodiment of the present invention will be described below with reference to FIGS. 1 and 5.

Figure 1:
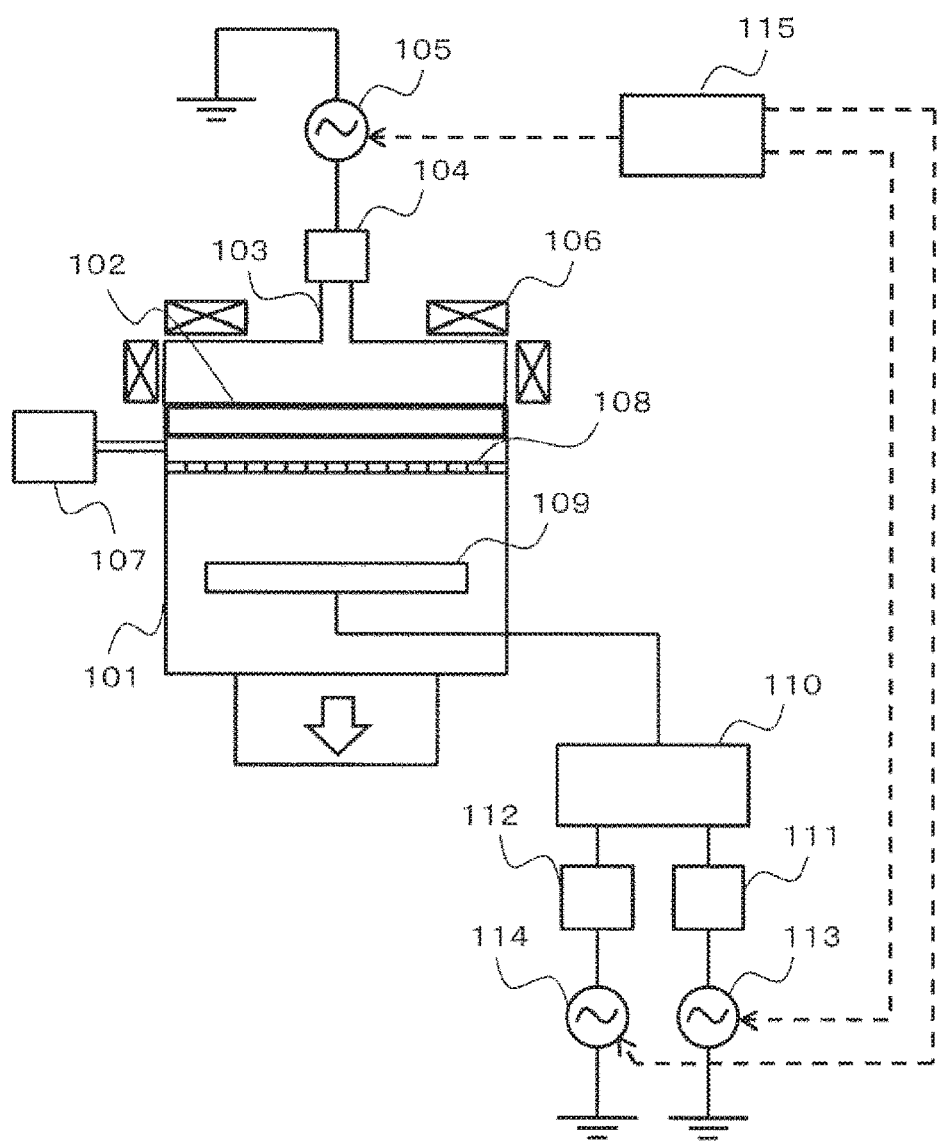
FIG. 1 is a schematic configuration diagram illustrating a plasma processing apparatus according to one embodiment of the present invention.

FIG. 1 illustrates a configuration of a plasma processing apparatus. In this case, a vacuum vessel 101 forming a processing chamber is, for example, a cylindrical vessel made of an electrically conductive material, such as aluminum, and is electrically grounded. An upper opening of the vacuum vessel 101 is sealed by a top plate 102 formed of a material permeable to an electromagnetic wave, such as, for example, quartz. A vacuum exhaust unit for exhausting the vacuum vessel 101 to reduce the pressure inside the vacuum vessel 101 to a predetermined pressure is connected to a bottom center portion of the vacuum vessel 101. A waveguide 103 is provided on the top plate 102 to cover the top plate 102. An RF power supply for plasma generation (hereinafter referred to as "plasma power supply 105") is further connected to the waveguide 103 with a matching device 104 interposed therebetween.

In this case, the plasma power supply 105 generates a microwave having a frequency of 2.45 GHz. The generated microwave propagates through both the waveguide 103 and the top plate 102, and is introduced into the vacuum vessel 101. A solenoid coil 106 for generating a magnetic field in the vacuum vessel 101 is wound around an outside of the vacuum vessel 101. A shower plate 108 is provided in an upper portion of the vacuum vessel 101 under the top plate 102, and a gas supply device 107 is connected to a portion between the top plate 102 and the shower plate 108 of the vacuum vessel 101.

A process gas is fed into a space between the top plate 102 and the shower plate 108 from the gas supply device 107, and the process gas is then fed, through the shower plate 108, into the processing chamber formed in the vacuum vessel. A sample stage 109 is provided in the vacuum vessel 101. A wafer is loaded through a wafer inlet (not shown), and is placed and held on the sample stage 109. A plurality of (in this case, two) RF power supplies for bias of different frequencies, which are a first RF bias power supply (hereinafter referred to as "first bias power supply 113") of a frequency of 13.56 MHz, and a second RF bias power supply (hereinafter referred to as "second bias power supply 114") of a frequency of 400 KHz, are electrically connected in parallel to the sample stage 109, with a filter 110, and respectively with a first and a second matching devices 111 and 112, interposed therebetween.

In this case, the filter 110 has a function (e.g., a function of high-pass filter) to prevent, from passing through to the first bias power supply 113, the output of any power supply other than the first bias power supply 113, including power supplies not shown (e.g., a power supply, connected to the sample stage 109, for the electrostatic chuck for holding the wafer; a power supply for a heater providing temperature control; and the like) during an output operation of the first bias power supply 113; and a function (e.g., a function of low-pass filter) to prevent, from passing through to the second bias power supply 114, the output of any power supply other than the second bias power supply 114, including power supplies not shown (e.g., a power supply, connected to the sample stage 109, for the electrostatic chuck for holding the wafer; a power supply for a heater providing temperature control; and the like) during an output operation of the second bias power supply 114. The plasma power supply 105 and the first and second bias power supplies 113 and 114 are connected to the control device 115 for output control of the power supplies as described herein later.

The apparatus configured as described above ionizes a process gas fed into the vacuum vessel 101 under interaction (e.g., electron cyclotron resonance (ECR)) between an electric field of a microwave applied through the top plate 102 and a magnetic field generated by the solenoid coil, and thus generates plasma in a space between the shower plate 108 and the sample stage 109.

The first bias power supply 113 applies an RF power having a frequency of 13.56 MHz, and the second bias power supply 114 applies an RF power having a frequency of 400 KHz, to the sample stage 109. These RF powers applied to the sample stage 109 generate a bias voltage to cause ions in the plasma to bombard the wafer, and are controlled independently of the generation of the plasma.

Ion bombardment energy is known to have different distributions depending on the frequency of the RF bias. As disclosed in PTL 1, an ion energy distribution has a smaller distribution width at a higher frequency, and has a broader distribution width with a peak in each tail portion of the distribution at a lower frequency. Different energy distributions of bombarding ions result in different processing states of wafer.

Figure 2:
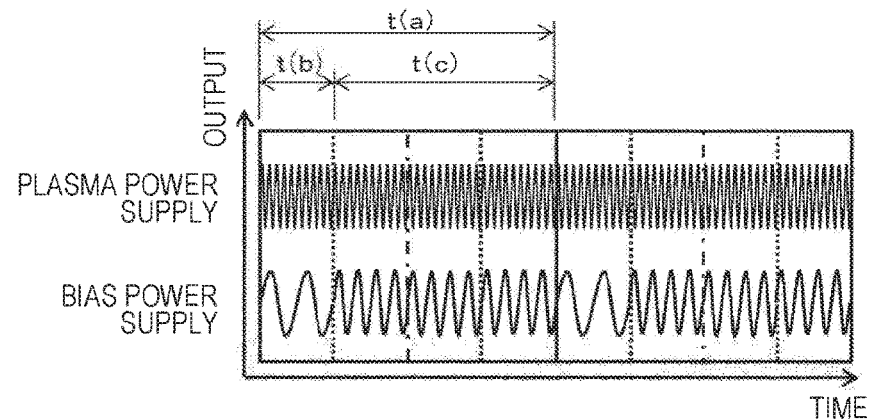
FIGS. 2(a) to 2(c) are a set of waveform charts each illustrating output situations of an RF power supply for plasma generation, and of RF power supplies for bias, included in the apparatus illustrated in FIG. 1.
Figure 2:
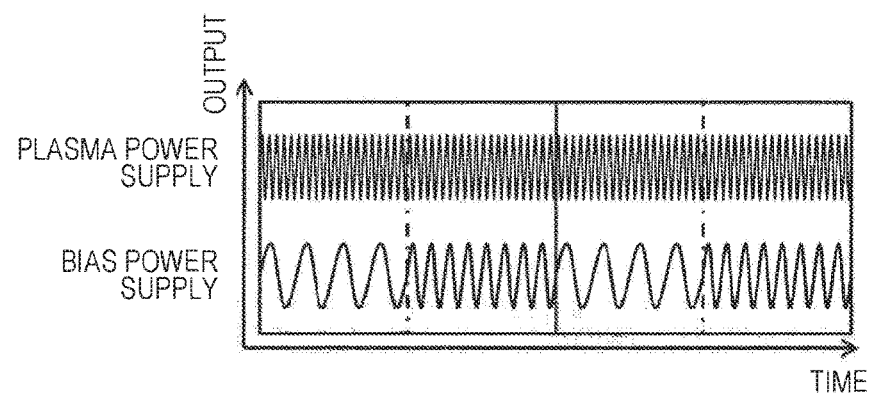
Figure 2:
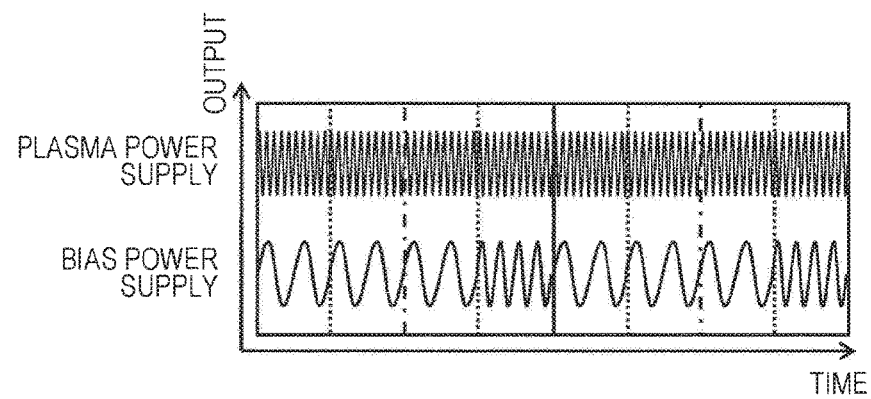

The control device 115 controls outputs of the plasma power supply 105 and of the first and second bias power supplies 113 and 114, for example, as illustrated in FIGS. 2(a) to 2(c). In all of FIGS. 2(a) to 2(c), the plasma power supply 105 continuously outputs a microwave to continuously generate plasma. The first and second bias power supplies 113 and 114 are continually switched from one to the other. The first and second bias power supplies 113 and 114 are switched from one to the other, as illustrated in FIG. 2(a), such that an RF power having the lower frequency (400 KHz) is supplied for a time duration t(b), after which an RF power having the higher frequency (13.56 MHz) is supplied for a time duration t(c). This cycle is repeated with a switching cycle time of time duration t(a).

The repetition frequency is determined in a range of from 100 Hz to 3 kHz (in this case, 1 KHz). The control device 115 has a function to set the ratio of each of the output time durations (t(b), t(c)) of the first and second bias power supplies 113 and 114 in one cycle (time duration t(a)) in a range of from 0% to 100%. FIG. 2(a) illustrates a case in which the ratios of the time duration t(b) and of the time duration t(c) in the time duration t(a) are respectively 20% (time duration t(b)) and 80% (time duration t(c)). FIG. 2(b) illustrates a case in which the ratios of the time duration t(b) and of the time duration t(c) are both 50%. FIG. 2(c) illustrates a case in which the ratio of the time duration t(b) is 80% and the ratio of the time duration t(c) is 20%.

Figure 4:
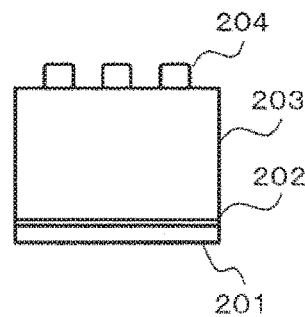
FIG. 4 is a diagram illustrating an example of a wafer to be etched in the situations illustrated in FIGS. 3(a) to 3(c).

In this case, etching processes using an RF power having the lower frequency (400 KHz) (LF) and an RF power having the higher frequency (13.56 MHz) (HF) output-controlled as illustrated in FIGS. 2(a) to 2(c) resulted in the etch rate distributions as illustrated in FIGS. 3(a) to 3(c). In this case, the etching processes were performed on a film structure illustrated in FIG. 4, that is, a wafer for forming a planar gate electrode, including a Si substrate 201, and a $SiO_2$ film 202, a poly-Si film 203, and a mask film 204 formed of a hard mask, being sequentially stacked on the Si substrate 201.

The etching processes were performed using a gas mixture of HBr and $O_2$ as the process gas at a total gas flow rate of 200 ml/min and at a pressure of 0.4 Pa, using an output power of the plasma power supply 105 of 800 W, and an output power of the first bias power supply 113 and an output power of the second bias power supply 114 each of 25 W. The etching processes were evaluated by etch rates of the poly-Si film and of the $SiO_2$ film.

FIG. 3(a) illustrates etch rate distributions corresponding to the output control illustrated in FIG. 2(a). At a ratio of LF:HF=20%:80%, the poly-Si film and the $SiO_2$ film both exhibited a lower etch rate at the center of the wafer, and a higher etch rate in an outer circumferential region. Let this distribution be called higher-in-circumference distribution. FIG. 3(b) illustrates etch rate distributions corresponding to the output control illustrated in FIG. 2(b). At a ratio of LF:HF=50%:50%, the poly-Si film and the $SiO_2$ film both exhibited an almost uniform etch rate distribution across the wafer surface. FIG. 3(c) illustrates etch rate distributions corresponding to the output control illustrated in FIG. 2(c). At a ratio of LF:HF=80%:20%, the poly-Si film and the $SiO_2$ film both exhibited a higher etch rate at the center of the wafer, and a lower etch rate in an outer circumferential region. Let this distribution be called higher-at-the-center distribution.

As described above, a gradual increase in the ratio of the time duration of supplying the RF power having the lower frequency in one cycle of switching between the RF power having the lower frequency (400 KHz) and the RF power having the higher frequency (13.56 MHz) reduces the etch rate in an outer circumferential region of the wafer. This shows that the etch rate distribution across the wafer surface is controllable. The result in which an increase in the ratio of the time duration of supplying the RF power having the lower frequency, or a decrease in the ratio of the time duration of supplying the RF power having the higher frequency, reduces the etch rate in an outer circumferential region of the wafer, may be accounted for the following.

The plasma processing apparatus according to this embodiment is a plasma processing apparatus using interaction between an electric field of a microwave and a magnetic field generated by a solenoid coil. In such apparatus, electrons in the plasma travel across the magnetic field generated in the vacuum vessel 101 when a current flows between the sample stage 109 and the grounded vacuum vessel 101 with the help of the plasma due to an RF power for bias applied to the sample stage 109. This configuration causes a difference in electron travel distance to an inner wall of the vacuum vessel 101 serving as the ground, between the center portion and an outer circumferential region of the wafer (i.e., the center portion of the wafer is farther from the inner wall of the vacuum vessel 101 than an outer circumferential region of the water). Thus, the center portion of the wafer has a higher impedance to the ground than an outer circumferential region of the wafer.

In addition, impedance relates to the frequency of an RF power such that a higher frequency leads to higher impedance. Thus, an RF power having the higher frequency causes a current to flow more readily in an outer circumferential region of the wafer having a lower impedance than in the center portion of the wafer. This causes more ions from the plasma to bombard the wafer by application of an RF bias in an outer circumferential region of the wafer, thereby resulting in a higher etch rate in an outer circumferential region of the wafer.

In contrast, an RF power having the lower frequency causes only a small increase in impedance by contribution of the frequency, thereby generating only a small difference between impedance in an outer circumferential region and impedance in an inner circumferential region of the wafer. Therefore, the flow rate of ions from the plasma has no difference on the wafer surface. However, the plasma processing apparatus according to this embodiment is configured such that the gas in the vacuum vessel 101 flows from the upper portion through a space near the sample stage 109 to the lower portion of the vacuum vessel 101, and is then exhausted.

Thus, the flow rate of active species from the plasma fed to an outer circumferential region of the wafer is lower than to the center portion of the wafer, thereby causing the lower etch rate in an outer circumferential region of the wafer, which generates a higher-at-the-center etch rate distribution. In addition, a low effect of the magnetic field at an RF power having the lower frequency maintains the etch rate distribution due to the apparatus configuration, thus finally results in the higher-at-the-center etch rate distribution. Note that the etch rate distribution is also affected by temperature control on the wafer surface, which, however, is not considered in this discussion.

As described above, this embodiment changes the ratios of the output time durations of the RF power having the lower frequency (400 KHz) and of the RF power having the higher frequency (13.56 MHz) to enable the etch rate distribution to be controlled in a range between a higher-in-circumference distribution and a higher-at-the-center distribution. Use of a condition in which the etch rate distribution is almost uniform as illustrated in FIG. 3(b) (i.e., ratios of the output time durations of the RF powers having the higher frequency and the lower frequency) can provide uniformity of the etch rate across the wafer surface. Thus, the configuration that allows alternate switching between outputs of the RF power having the lower frequency and of the RF power having the higher frequency, and allows controlling the ratios of the output time durations of the respective RF powers, can further improve controllability of ion bombardment on a wafer.

In addition, in this embodiment, two RF powers having different frequencies are supplied to the sample stage 109, and when one of the bias power supplies is supplying an RF power, the other bias power supply stops supplying an RF power, and thus no current from the other bias power supply flows into the sample stage 109. This can prevent crosstalk from occurring, and therefore can stably provide the RF power for bias to the sample stage 109.

In this case, an RF power supply of 13.56 MHz and an RF power supply of 400 KHz are used as the bias power supplies. Note that selection of the different frequencies should be made such that ions in the plasma can reach the sample stage 109 with these frequencies, and a large difference in impedance occurs at these frequencies. One switching cycle may start either with the RF power having the lower frequency or with the RF power having the higher frequency.

Figure 5:
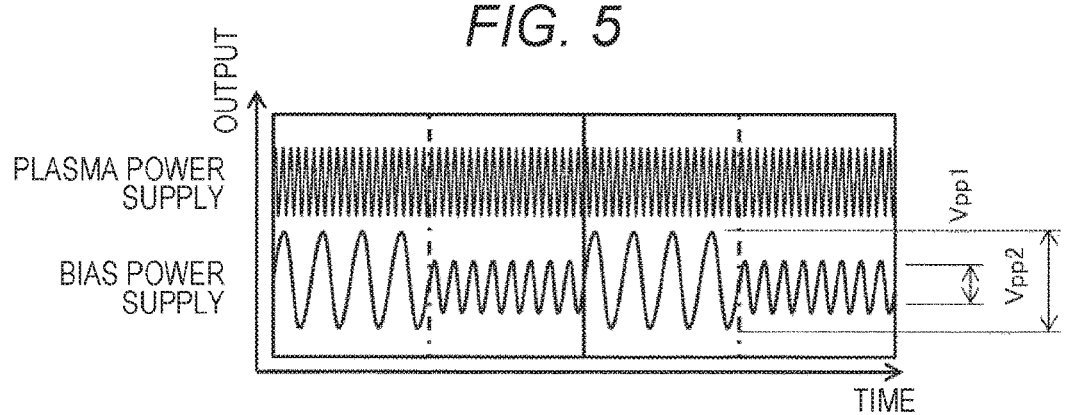
FIG. 5 is a pair of waveform charts illustrating another example of the output situations illustrated in FIGS. 2(a) to 2(c).

The output example of the bias power supply illustrated in FIGS. 2(a) to 2(c) illustrates the RF power supplies of the lower and higher frequencies as having a same output voltage (Vpp). However, as illustrated in FIG. 5, the output voltage (Vpp1) of the RF power supply of the lower frequency and the output voltage (Vpp2) of the RF power supply having the higher frequency may also be set to different values. Although this case assumes a relationship of Vpp1>Vpp2, the relationship may be opposite.

As described above, this embodiment can change the ratios of the outputs of the first bias power supply and of the second bias power supply in one cycle, alternately switch these outputs, and apply the alternate outputs to the sample stage in a periodic manner. Thus, the etch rate distribution across the wafer surface can be controlled to improve uniformity across the wafer surface, and also to control the etch profile distribution across the wafer surface.

Switching between RF power supplies of different frequencies as illustrated in FIGS. 2(a) to 2(c) and 5 enables each of the RF power supplies to output a permitted maximum power within the electrically allowable range of the sample stage to which the RF powers for bias are applied. This increases flexibility of settings suitable for the process.

Figure 6:
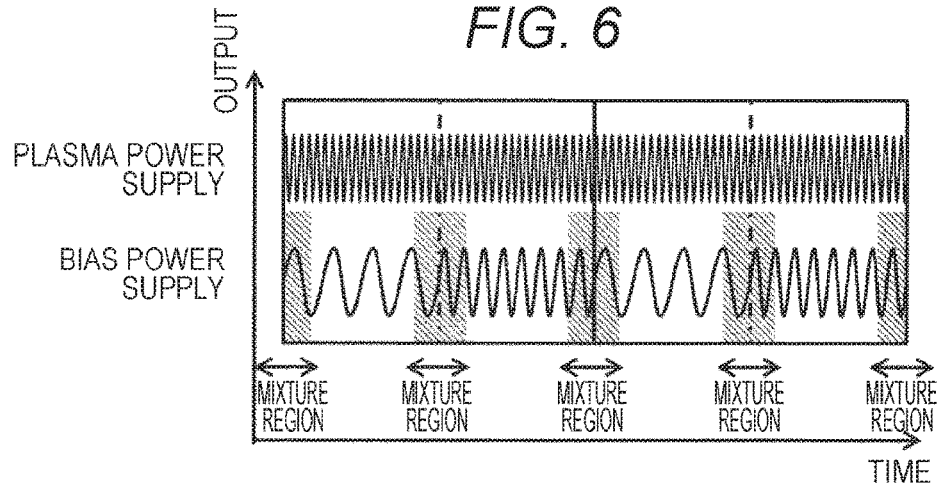
FIG. 6 is a pair of waveform charts illustrating still another output example of the RF power supply for plasma generation, and of the RF power supplies for bias, included in the apparatus illustrated in FIG. 1.
Figure 7:
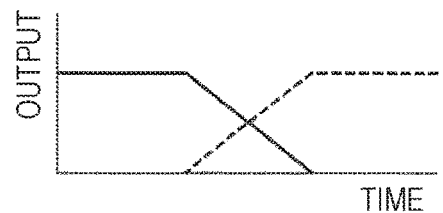
FIGS. 7(a) and 7(b) are a set of diagrams each illustrating an example of switched output in an output mixture region of the RF power supplies for bias in the output waveform illustrated in FIG. 6.
Figure 7:
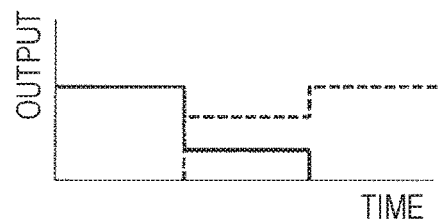

The embodiment described above continually switches the outputs of the bias power supplies between the RF power having the lower frequency and the RF power having the higher frequency, without introducing a temporal overlap therebetween as illustrated in FIGS. 2(a) to 2(c) and 5. However, as illustrated in FIG. 6, a mixture region may be provided during switching. The outputs from the respective RF power supplies in a mixture region during switching are controlled such that, as illustrated in FIG. 7(a), the output of the previous RF power supply is gradually reduced, while the output of the next RF power supply is gradually increased, Or alternatively, the output of the previous RF power supply is stepwise reduced, while the output of the next RF power supply is stepwise increased, as illustrated in FIG. 7(b). Note that the sum (total) of the outputs of the respective RF power supplies in a mixture region needs to be not more than a permitted maximum value. Matching of the RF power having the lower frequency and matching of the RF power having the higher frequency are desirably each performed during a time period other than a mixture region. In doing so, matching of the RF power having the lower frequency and matching of the RF power having the higher frequency can each be stably performed. A second embodiment of the present invention will next be described with reference to FIGS. 8 and 12.

Figure 8:
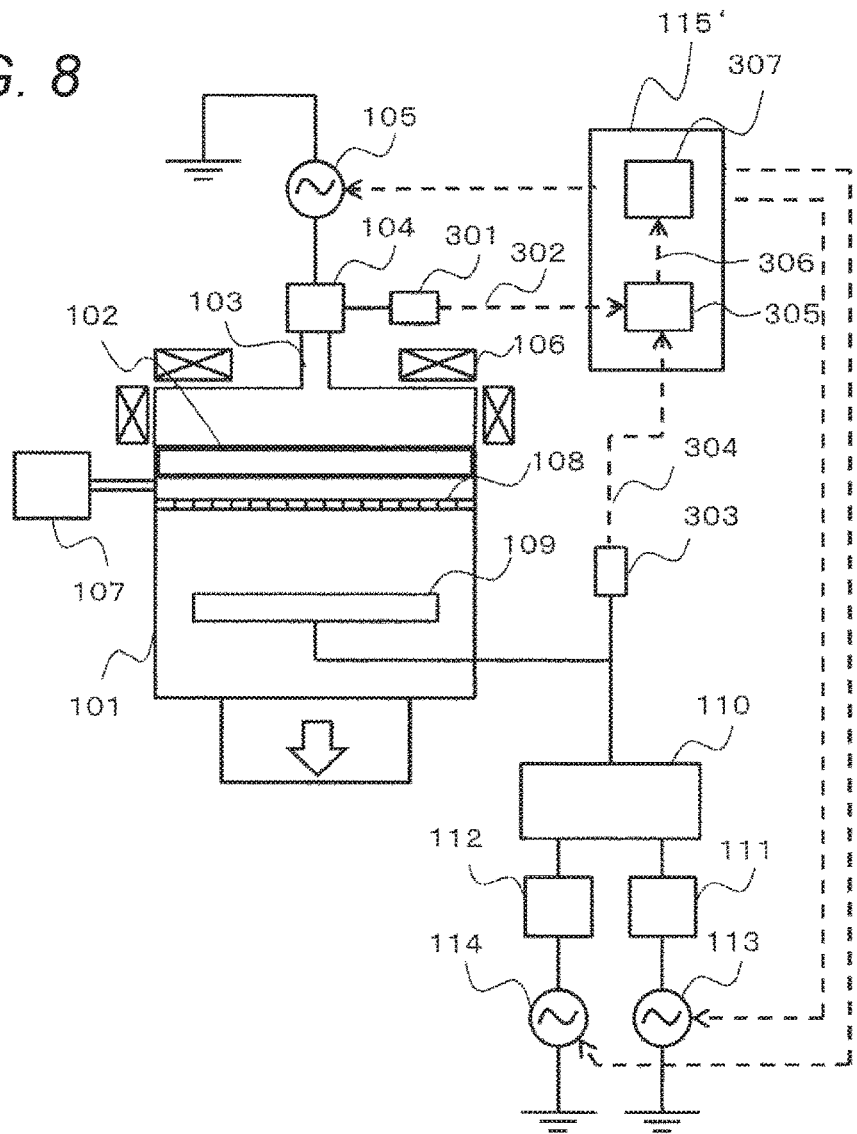
FIG. 8 is a schematic configuration diagram illustrating a plasma processing apparatus according to a second embodiment of the present invention.

FIG. 8 illustrates a configuration of a plasma processing apparatus. In FIG. 8, the same reference numerals as those used in FIG. 1 represent equivalent elements, and the explanation thereof will be omitted. The plasma processing apparatus of this figure differs from the plasma processing apparatus of FIG. 1 in that when the outputs of the plasma power supply and of the bias power supplies are detected, and the output of the plasma power supply is intermittently time modulated, the timings of the outputs of the bias power supplies can be controlled to synchronize these outputs. A Vpp detector 301 is connected to the matching device 104 for the plasma power supply 105. The Vpp detector 301 detects a rising edge of the output of the plasma power supply 105, and transmits a detection signal to an output detection unit 305 as a trigger signal 302.

Figure 9:
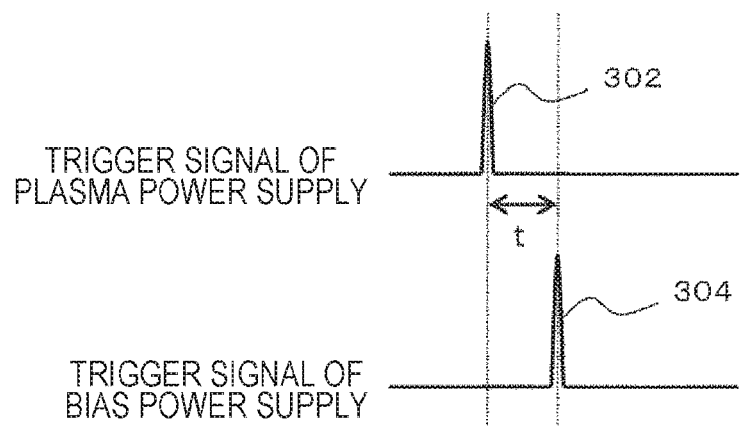
FIG. 9 is a diagram illustrating trigger signals for controlling an RF power supply for plasma generation and RF power supplies for bias included in the apparatus illustrated in FIG. 8

A Vpp detector 303 is connected to the sample stage 109. The Vpp detector 303 detects rising edges of the outputs of the first bias power supply 113 and of the second bias power supply 114, and transmits a detection signal to the output detection unit 305 as a trigger signal 304. The output detection unit 305 calculates a time difference (t) of the trigger signals 302 and 304 illustrated in FIG. 9 transmitted from the Vpp detectors 301 and 303, and transmits the calculated value to an output control unit 307 as a time difference signal 306. The output control unit 307 corrects the time difference (t) on the basis of the time difference signal 306 received to synchronize the outputs of the plasma power supply 105, of the first bias power supply 113, and of the second bias power supply 114, which are controlled by a control device 115'.

In this case, the output detection unit 305 and the output control unit 307 are provided in the control device 115'. However, these components may be provided outside the control device, and may be configured such that the values corrected by the output control unit 307 be transmitted, as the respective correction signals, to the plasma power supply 105, to the first bias power supply 113, and to the second bias power supply 114 for feedback, and synchronization be thus maintained between the outputs of the first bias power supply 113 and of the second bias power supply 114, and the output of the plasma power supply 105.

Figure 10A:
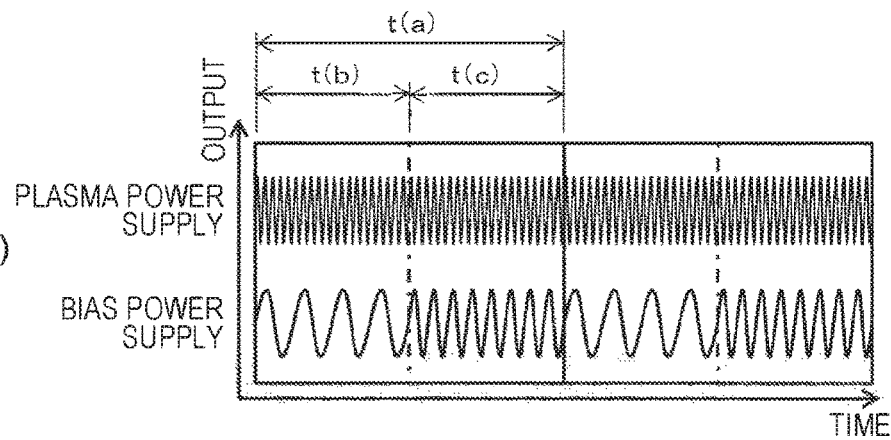
FIGS. 10(a) to 10(c) are a set of waveform charts each illustrating output situations of the RF power supply for plasma generation, and of the RF power supplies for bias, included in the apparatus illustrated in FIG. 8.
Figure 10B:
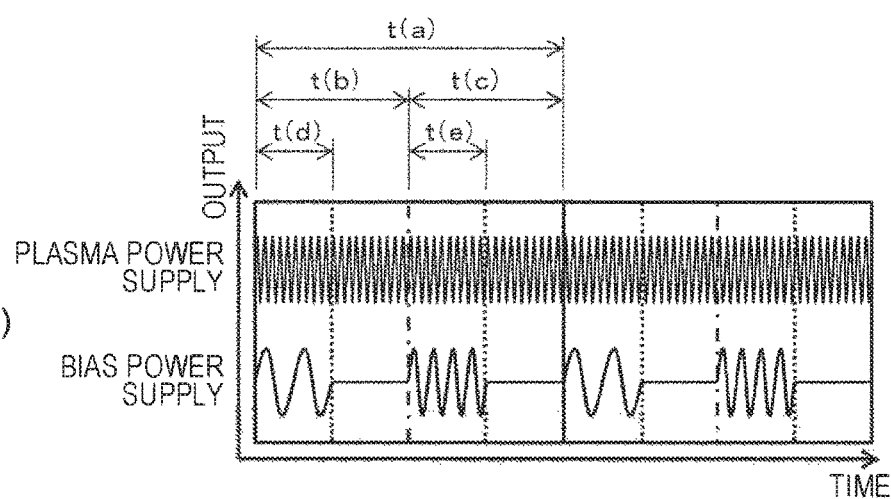
Figure 10C:
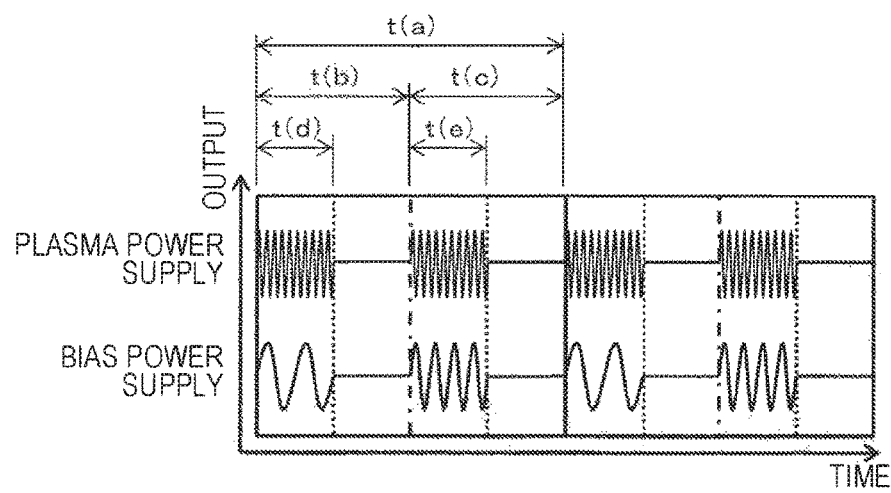

The plasma power supply 105, and the first and second bias power supplies 113 and 114 provided in an apparatus having the configuration described above are output controlled, for example, as illustrated in FIGS. 10(a) to 10(c). FIG. 10(a) illustrates output situations similar to the output situations of FIG. 2(b). Thus, control similar to the control provided by the one embodiment described above can also be provided, in which an RF power having the lower frequency is supplied for a time duration t(b), after which an RF power having the higher frequency is supplied for a time duration t(c). This cycle is repeated with a cycle time of time period t(a).

FIG. 10(b) illustrates a case in which the RF power for plasma is continuous, while the RF powers for bias are controlled with a duty cycle to alternately output the RF powers in an intermittent manner. In this case, the outputs of the first and second bias power supplies 113 and 114 are both controlled with a duty cycle of 50%. The RF power having the lower frequency is supplied for a time duration t(d), followed by a power supply interruption period, and then the RF power having the higher frequency is supplied for a time duration t(e), followed by another power supply interruption period. This cycle is repeated with a cycle time of time period t(a).

FIG. 10(c) illustrates a case in which the outputs of the RF power for plasma and of the RF power for bias are controlled with a same duty cycle to alternately output the RF powers in an intermittent manner. In this case, the RF power for plasma generation provides an output having a cycle time of time period (b), and supplies a power with a duty cycle of 50% for a time duration t(d), thereby causing intermittent discharge, i.e., pulse discharge, to occur. In this case, the length of the time duration t(b) is equal to the length of the time duration t(c), and the length of the time duration t(d) is equal to the length of the time duration t(e). Meanwhile, the outputs of the first and second bias power supplies 113 and 114 are similar to the outputs of FIG. 10(b), and have a cycle time of time duration t(a).

That is, the repetition frequency of the output of the plasma power supply is twice as high as the repetition frequency of the output of each of the bias power supplies. The RF power for bias having the lower frequency (time duration t(d)) and the RF power for bias having the higher frequency (time duration t(e)) are supplied in synchronization with the output of the RF power for plasma generation.

In this case, etching processes using the RF power for plasma and the RF powers for bias having the lower and higher frequencies output-controlled as illustrated in FIGS. 10(a) to 10(c) exhibit the etch rate distributions illustrated in FIG. 11. The etch rate distributions of a wafer illustrated in FIG. 11 are results of etching a wafer having a layered structure illustrated in FIG. 4 similarly to the one embodiment described above. FIG. 11(a) corresponds to the control of FIG. 10(a), and the etch rate illustrated has an almost uniform distribution across the wafer surface similarly to the case of FIG. 3(b). This process resulted in a poly-Si etch rate of 51.6 nm/min and a $SiO_2$ etch rate of 1.7 nm/min, thereby providing a poly-Si/$SiO_2$ selectivity of 30.4.

FIG. 11(b) corresponds to the control of FIG. 10(b), which turns on and off the outputs of the RF powers for bias each with a duty cycle of 50%. The etch rate had an almost uniform distribution across the wafer surface. The control of FIG. 10(b) reduced the poly-Si etch rate from 51.6 nm/min to 45.2 nm/min, and the $SiO_2$ etch rate from 1.7 nm/min to 0.9 nm/min, but increased the poly-Si/$SiO_2$ selectivity from 30.4 to 50.2, and thus yielded a high selectivity as compared to the results (FIG. 11(a)) of the output control of FIG. 10(a), as illustrated in FIG. 11(b).

FIG. 11(c) corresponds to the control of FIG. 10(c), which turns on and off the outputs of both the RF power for plasma generation and the RF powers for bias each with a duty cycle of 50%. Similarly to the case of FIG. 11(b), the etch rate had an almost uniform distribution across the wafer surface. The control of FIG. 10(c) reduced the poly-Si etch rate from 45.2 nm/min to 30.2 nm/min, and the $SiO_2$ etch rate from 0.9 nm/min to 0.6 nm/min, as compared to the results (FIG. 11(b)) of the output control of FIG. 10(b). However, the poly-Si/$SiO_2$ selectivity was 50.3, and thus a high selectivity was also provided as illustrated in FIG. 11(c).

Figure 12:
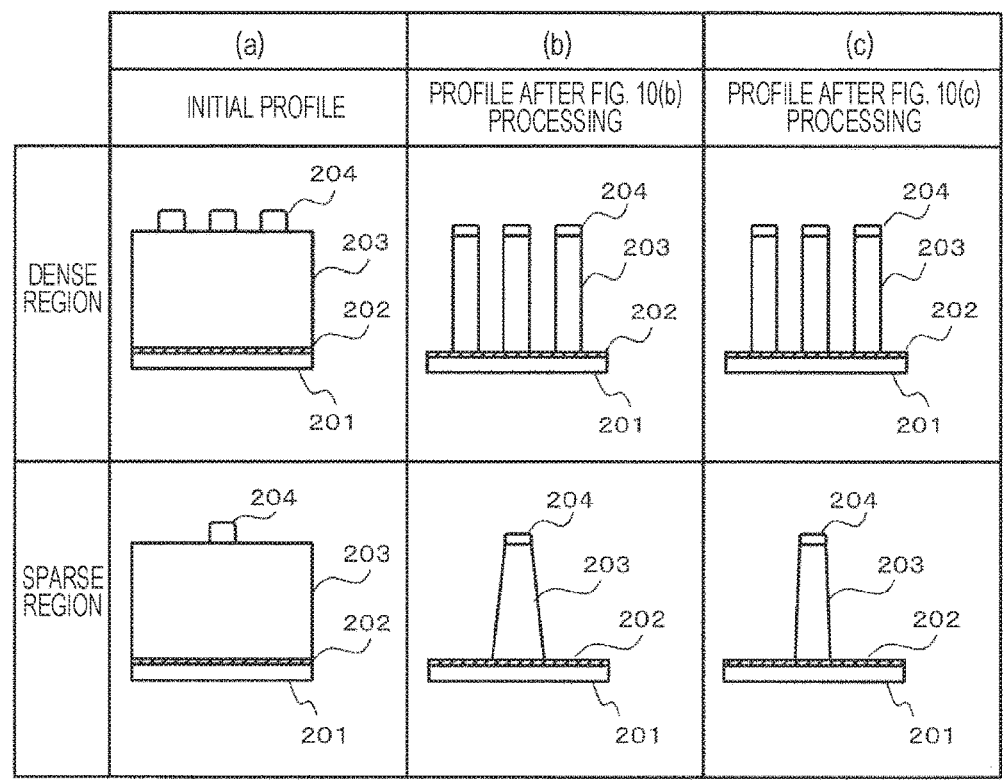
FIG. 12 is a set of diagrams each illustrating etch profiles in the output situations when a wafer is etched using the outputs illustrated in FIGS. 10(a) to 10(c).

FIG. 12 illustrates etch profiles of when a wafer was etched under the controls illustrated in FIGS. 10(b) and 10(c). FIG. 12 at(a) illustrates an initial profile before etching, having a dense/sparse pattern formed on the wafer having the layered structure illustrated in FIG. 4 described above. FIG. 12 at(b) illustrates an etch profile after the process under the output control of FIG. 10(b). When control is provided as illustrated in FIG. 10(b), that is, when on/off control is performed only on the RF powers for bias during continuous discharge, the poly-Si film 203 in a dense region is vertically etched, while the poly-Si film 203 in a sparse region has a tapered profile.

FIG. 12 at(c) illustrates an etch profile after the process under the output control of FIG. 10(c). When control is provided as illustrated in FIG. 10(c), that is, when on/off control is performed, in synchronization, on both the RF power for plasma generation and the RF powers for bias, the poly-Si film 203 in a dense region is vertically etched, and the poly-Si film 203 in a sparse region is also substantially vertically etched.

As described above, in comparison between the controls illustrated in FIGS. 10(b) and 10(c), the control of FIG. 10(c) reduced the etch rate as described above; however, as far as etch profile is concerned, the on/off control in synchronization of both the RF power for plasma generation and the RF powers for bias provides uniformity of etch profile across the wafer surface during etching of a wafer having a dense/sparse pattern, and such on/off control is more advantageous than performing the on/off control only on the RF powers for bias. The reason for this is thought as follows. The use of pulse discharge for plasma generation as illustrated in FIG. 10(c) enables the degree of dissociation of the plasma to be controlled to reduce generation of depositional species in the plasma. This optimizes the amount of depositional species supplied to etched side walls in dense and sparse regions, thereby enabling an etching process to be provided that forms a substantially vertical profile acceptable in dense and sparse regions.

Although FIGS. 10(b) and 10(c) illustrate examples of providing on/off control of RF powers for plasma generation or/and for bias each with a duty cycle of 50%, it is needless to say that the optimum duty cycle of an "on" state may be changed, that is, the ratio of the time duration t(d) to the time duration t(b), and the ratio of the time duration t(e) to the time duration t(c) may be changed, depending on quality and/or structure of the etched material to be processed.

Although the example of FIG. 10(b) uses a duty cycle that causes both the RF powers for bias having the higher and lower frequencies to be intermittently turned on and off, a duty cycle of 100% may be used for either one of the RF powers having the higher and lower frequencies, and only the other RF power may be intermittently turned on and off. In addition, although the example of FIG. 10(c) provides control such that the RF powers for plasma generation and for bias are turned on and off at a substantially same time, the timings of turning on and off the RF powers for bias are not limited to the timings described above as long as the RF powers for bias are turned on and off during an "on" time of the RF power for plasma generation.

As described above, the second embodiment can adjust the etch rate distribution across the wafer surface similarly to the one embodiment described above to pursue etch rate uniformity across the wafer surface. In addition, the additional use of time modulation for turning on and off the RF powers also improves etch profile uniformity across the wafer surface. Thus, the use of a configuration that provides alternate switching between the outputs of an RF power having a lower frequency and of an RF power having a higher frequency, and enables the ratios of the output time durations of these RF powers to be controllable can further improve controllability of ion bombardment on a wafer.

In the second embodiment described above, the example of FIG. 10(c) has been described assuming that the time duration t(b) and the time duration t(c), which are each one cycle of turning on and off the RF power for plasma generation, are identical, and the sum of the time period (b) and the time period (c) is equal to the time duration t(a), which is one cycle of switching between the RF powers for bias having the lower and higher frequencies. However, as illustrated in FIGS. 13 and 15, the RF powers for bias having the lower and higher frequencies may be switched within a time duration t(f), defined as a time period during which the RF power for plasma generation is in an "on" state, within the time duration t(a), which is one cycle of switching between the RF powers for bias having the lower and higher frequencies.

Figure 13:
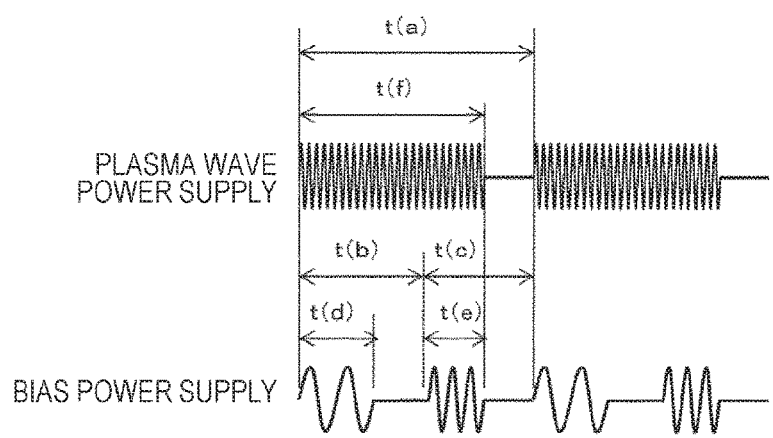
FIG. 13 is a waveform chart illustrating still another output example of the RF power supply for plasma generation, and of the RF power supplies for bias, included in the apparatus illustrated in FIG. 8.

FIG. 13 illustrates an example in which the ratio, the output time duration t(b) of the RF power having the lower frequency, and the output time duration t(c) of the RF power having the higher frequency are set within the time duration (a) of one cycle; the time durations t(d) and t(e) of an "on" state of the outputs of the RF powers respectively in the time durations t(b) and t(c) are set (or, duty cycles of "on" times are set); and the total time of the output time duration t(b) of the RF power for bias having the lower frequency and the "on" time duration t(e) of the RF power having the higher frequency is set to a value equal to the "on" time duration t(f) of the RF power for plasma generation during which plasma is generated.

Figure 14:
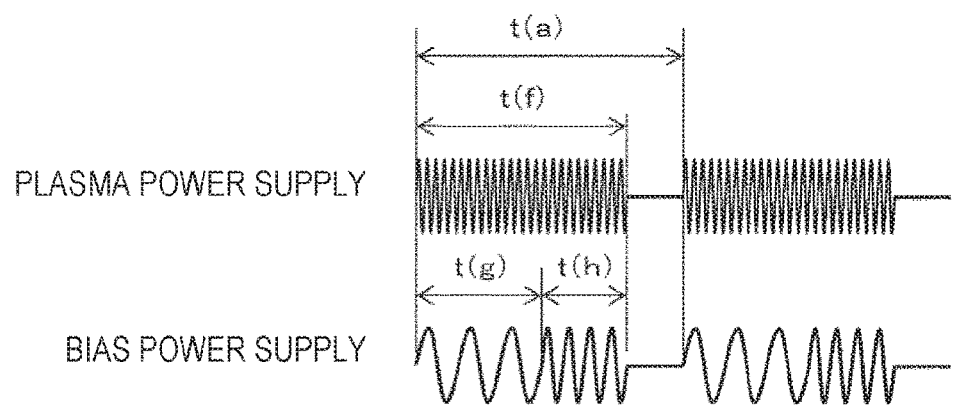
FIG. 14 is a waveform chart illustrating still another output example of the RF power supply for plasma generation, and of the RF power supplies for bias, included in the apparatus illustrated in FIG. 8.

FIG. 14 illustrates an example in which the "on" time duration t(f) of the RF power for plasma generation is set (or, the duty cycle of "on" time is set) within the time duration (a) of one cycle; and the ratio between the output time duration t(g) of the RF power for bias having the lower frequency and the output time duration t(h) of the RF power having the higher frequency is set (or, the output time durations t(g) and t(h) are themselves set) within the time duration t(f). In this case, the time duration in which the RF power for plasma generation is turned off in the time duration t(a) of one cycle is the time duration in which the RF powers for bias are also turned off.

Figure 15:
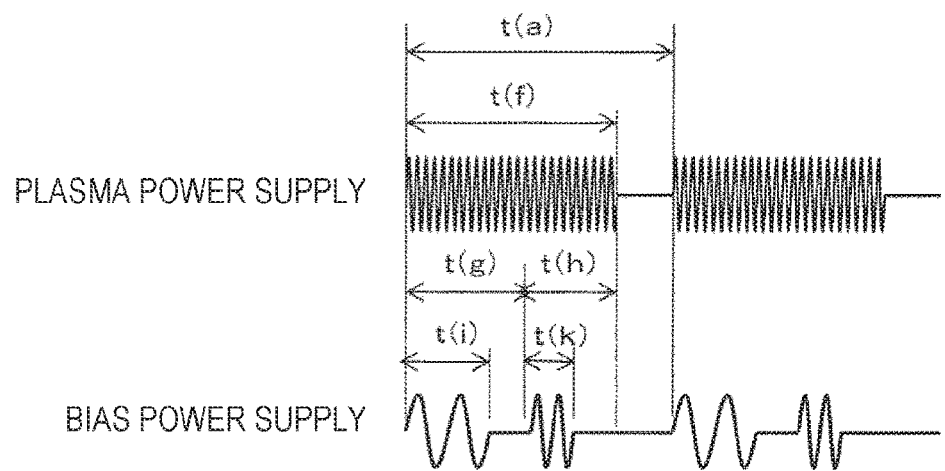
FIG. 15 is a waveform chart illustrating still another output example of the RF power supply for plasma generation, and of the RF power supplies for bias, included in the apparatus illustrated in FIG. 8.

FIG. 15 illustrates an example in which "on" time durations t(i) and t(k) of the RF powers are set (or, dety cycles of "on" times are set) respectively within the output time duration t(g) of the RF power for bias having the lower frequency and within the output time duration t(h) of the RF power for bias having the higher frequency in FIG. 14.

The embodiments described above assume that the first and second bias power supplies 113 and 114 are connected to the sample stage that accepts the entire surface of a wafer to allow the RF powers for bias to act on the entire surface of the wafer. However, each of the plasma processing apparatuses may be configured such that the sample stage be divided into multiple sections, and the first and second bias power supplies 113 and 114 be connected to each of the multiple sections resulting from the division, for example, along a radial direction, along a circumferential direction, or along these directions in combination to provide bias control under a different condition for each section. In this case, the bias power supplies may be arranged such that (1) the apparatus includes multiple pairs of bias power supplies, and each of these pairs of bias power supplies provides independent control, or (2) a pair of bias power supplies is connected to these sections in parallel, and a control circuit is provided capable of controlling outputs of the RF powers that are continuously output from the pair of bias power supplies, by using different ratios of the output time durations for each section, thereby to provide control under a different condition for each section.

In addition, the embodiments described above have been described in terms of examples in which the present invention is applied to a microwave plasma apparatus having a magnetic field. However, needless to say, the plasma processing apparatus is not limited to this, and the present invention is also applicable to an inductively-coupled or capacitively-coupled plasma processing apparatus.

Moreover, the present invention is also applicable to a plasma processing apparatus that either has a magnetic field, or does not use a magnetic field. Note that, unlike a microwave plasma apparatus having a magnetic field that generates plasma using a magnetic field in electron cyclotron resonance (ECR), in which plasma generation and bias control are readily controlled independently, an apparatus that does not use a magnetic field may have an effect on plasma generation depending on the frequency of the RF power supply for bias (in particular, when a frequency of 13.56 MHz or higher is used), and therefore needs consideration of, for example, using an output that would not largely affect plasma generation.

REFERENCE SIGNS LIST 101 vacuum vessel
102 top plate
103 waveguide
104 matching device
105 plasma power supply
106 solenoid coil
107 gas supply device
108 shower plate
109 sample stage
110 filter
111 first matching device
112 second matching device
113 first bias power supply
114 second bias power supply
115, 115' control device
201 Si substrate
202 $SiO_2$ film
203 poly-Si film
204 mask film
301, 303 Vpp detector
302, 304 trigger signal
305 output detection unit
306 time difference signal
307 output control unit

The invention claimed is:

1. A plasma processing method for processing, using plasma, a sample mounted on a sample stage, the method comprising:
   supplying a first RF power and a second RF power to the sample stage through a filter, which includes a first filter and a second filter, while periodically switching between the first RF power provided by a first RF power source and the second RF power provided by a second RF power source using the first filter and the second filter,
   wherein the first filter passes the first RF power of a first frequency and does not pass the second RF power of a second frequency,
   wherein the second filter passes the second RF power of the second frequency and does not pass the first RF power of the first frequency, and
   wherein the first frequency is higher than the second frequency.

2. The plasma processing method according to claim 1, wherein the first RF power and the second RF power are combined when switching between the first RF power and the second RF power.

3. The plasma processing method according to claim 1, wherein the first RF power or the second RF power is on-off modulated.

4. The plasma processing method according to claim 1, wherein
   an RF power for generating the plasma, the first RF power, and the second RF power are on-off modulated,
   a time duration of supply of the first RF power to the sample stage and a time duration of supply of the second RF power to the sample stage are identical, and
   a cycle time of the on-off modulation of the RF power, a cycle time of the on-off modulation of the first RF power, and a cycle time of the on-off modulation of the second RF power are identical.

5. The plasma processing method according to claim 1, wherein an output voltage of the first RF power and an output voltage of the second RF power differ from each other.

6. The plasma processing method according to claim 5, wherein the output voltage of the first RF power is smaller than the output voltage of the second RF power.

7. The plasma processing method according to claim 1, wherein
   a third RF power for generating the plasma, the first RF power, and the second RF power are on-off modulated, and
   a sum of on-time duration of the on-off modulated first RF power and one cycle time of the on-off modulated second RF power is equal to an on-time duration of the on-off modulated third RF power.

8. The plasma processing method according to claim 1, wherein
   a third RF power for generating the plasma is on-off modulated,
   a sum of time duration of supply of the first RF power to the sample stage and a time duration of supply of the second RF power to the sample stage is equal to an on-time duration of the on-off modulated third RF power, and
   a time of not supplying the first RF power and the second RF power to the sample stage is equal to the off-time duration of the on-off modulated third RF power.

9. The plasma processing method according to claim 8, wherein
   the first RF power and the second RF power are on-off modulated.

* * * * *